(12) United States Patent
Ganguli et al.

(10) Patent No.: US 11,972,969 B2
(45) Date of Patent: *Apr. 30, 2024

(54) LASER ALIGNMENT FIXTURE FOR A REACTOR SYSTEM

(71) Applicant: ASM IP Holding B.V., Almere (NL)

(72) Inventors: Surojit Ganguli, Tempe, AZ (US); Todd Robert Dunn, Cave Creek, AZ (US); Ankit Kimtee, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/130,543

(22) Filed: Apr. 4, 2023

(65) Prior Publication Data

US 2023/0245911 A1 Aug. 3, 2023

Related U.S. Application Data

(63) Continuation of application No. 17/319,146, filed on May 13, 2021, now Pat. No. 11,626,308.

(60) Provisional application No. 63/024,294, filed on May 13, 2020.

(51) Int. Cl.
*H01L 21/68* (2006.01)
*G01N 21/03* (2006.01)
*H01L 29/06* (2006.01)

(52) U.S. Cl.
CPC ....... *H01L 21/681* (2013.01); *G01N 21/0303* (2013.01); *H01L 29/0665* (2013.01)

(58) Field of Classification Search
CPC .............. H01L 21/681; H01L 29/0665; G01N 21/0303
See application file for complete search history.

(56) References Cited

U.S. PATENT DOCUMENTS

| | | | |
|---|---|---|---|
| 11,171,023 B2* | 11/2021 | Chu | H01L 21/268 |
| 11,251,068 B2* | 2/2022 | Roh | H01J 37/32642 |
| 11,626,308 B2* | 4/2023 | Ganguli | H01L 21/681 356/400 |
| 2012/0208377 A1* | 8/2012 | Timans | H01L 21/67115 257/E21.333 |

* cited by examiner

*Primary Examiner* — Hung V Nguyen
(74) *Attorney, Agent, or Firm* — Snell & Wilmer L.L.P.

(57) ABSTRACT

A laser alignment fixture for a reactor system may be used to align components of the reactor system to allow for a uniform deposition of a thin film onto a substrate. The laser alignment fixture may include: a lid assembly; and a plurality of laser and sensor assemblies. The laser alignment fixture may align at least: a flow control ring, a susceptor, and a side wall of the reactor system.

20 Claims, 6 Drawing Sheets

LASER ALIGNMENT FIXTURE FOR A REACTOR SYSTEM

CROSS-REFERENCE TO RELATED APPLICATIONS

This application is a continuation of, and claims priority to and the benefit of, U.S. patent application Ser. No. 17/319,146, filed May 13, 2021 and entitled "LASER ALIGNMENT FIXTURE FOR A REACTOR SYSTEM," now U.S. Pat. No. 11,626,308 issued Apr. 11, 2023, which is a non-provisional of, and claims priority to and the benefit of, U.S. Provisional Patent Application No. 63/024,294, filed May 13, 2020 and entitled "LASER ALIGNMENT FIXTURE FOR A REACTOR SYSTEM," both of which are hereby incorporated by reference herein.

FIELD OF THE DISCLOSURE

The present disclosure generally relates to a laser alignment fixture for positioning a component within a reactor system. A related fixture is disclosed in U.S. Patent Application No. 62/985,184, entitled "Alignment Fixture for a Reactor System" and filed on Mar. 4, 2020, the contents of which are hereby incorporated in its entirety by reference, to the extent such contents do not conflict with the present disclosure.

BACKGROUND

Reaction chambers may be used for depositing various material layers onto semiconductor substrates. A semiconductor may be placed on a susceptor inside a reaction chamber. Both the substrate and the susceptor may be heated to a desired substrate temperature set point. In an example substrate treatment process, one or more reactant gases may be passed over a heated substrate, causing the deposition of a thin film of material on the substrate surface. Throughout subsequent deposition, doping, lithography, etch, and other processes, these layers can be used in the formation of integrated circuits.

To achieve desired results on the substrate (e.g., uniform or robust deposition of a film on the substrate), the susceptor and/or substrate may be disposed within the reaction chamber in a certain position. For example, the susceptor may be disposed, such that there is a desired space between the susceptor and sidewall of the reaction chamber (e.g., a uniform space resulting from the susceptor being centered within the reaction chamber). Such positioning may prevent uneven processing of the substrate within the reaction chamber, and may facilitate achieving desired results. However, achieving the desired position of the susceptor or other components in a reaction chamber may be difficult, and errors in such positioning may cause undesirable processing outcomes.

Achieving the desired position may be made difficult by the environment. Many of the substrate treatment processes may occur at high temperatures and low pressures. As a result, a system that allows for precise alignment and leveling of components within the reaction chambers at particular environmental conditions is desired.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In accordance with at least one embodiment of the invention, a laser alignment fixture for a reactor system is disclosed. The reactor system is used to deposit a thin film on a substrate. The laser alignment fixture comprises: a lid assembly configured to be placed on the reactor system, the lid assembly comprising a viewing window; a plurality of laser and sensor assemblies disposed on the lid assembly; wherein the reactor system comprises: a susceptor, wherein the susceptor is configured to receive a substrate thereon; a susceptor positioning system configured to move the susceptor along an x-y plane; a flow control ring disposed on an outer edge of the susceptor; and a spacer plate contacting the flow control ring and disposed on an outer edge of the flow control ring; wherein the plurality of laser and sensor assemblies shine and sense a light used to determine an alignment of the susceptor, the flow control ring, and the spacer plate; wherein the light is used to adjust a position of the susceptor by using the susceptor positioning system.

All of these embodiments are intended to be within the scope of the disclosure. These and other embodiments will become readily apparent to those skilled in the art from the following detailed description of certain embodiments having reference to the attached figures, the disclosure not being limited to any particular embodiment(s) discussed.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

Figure 1:
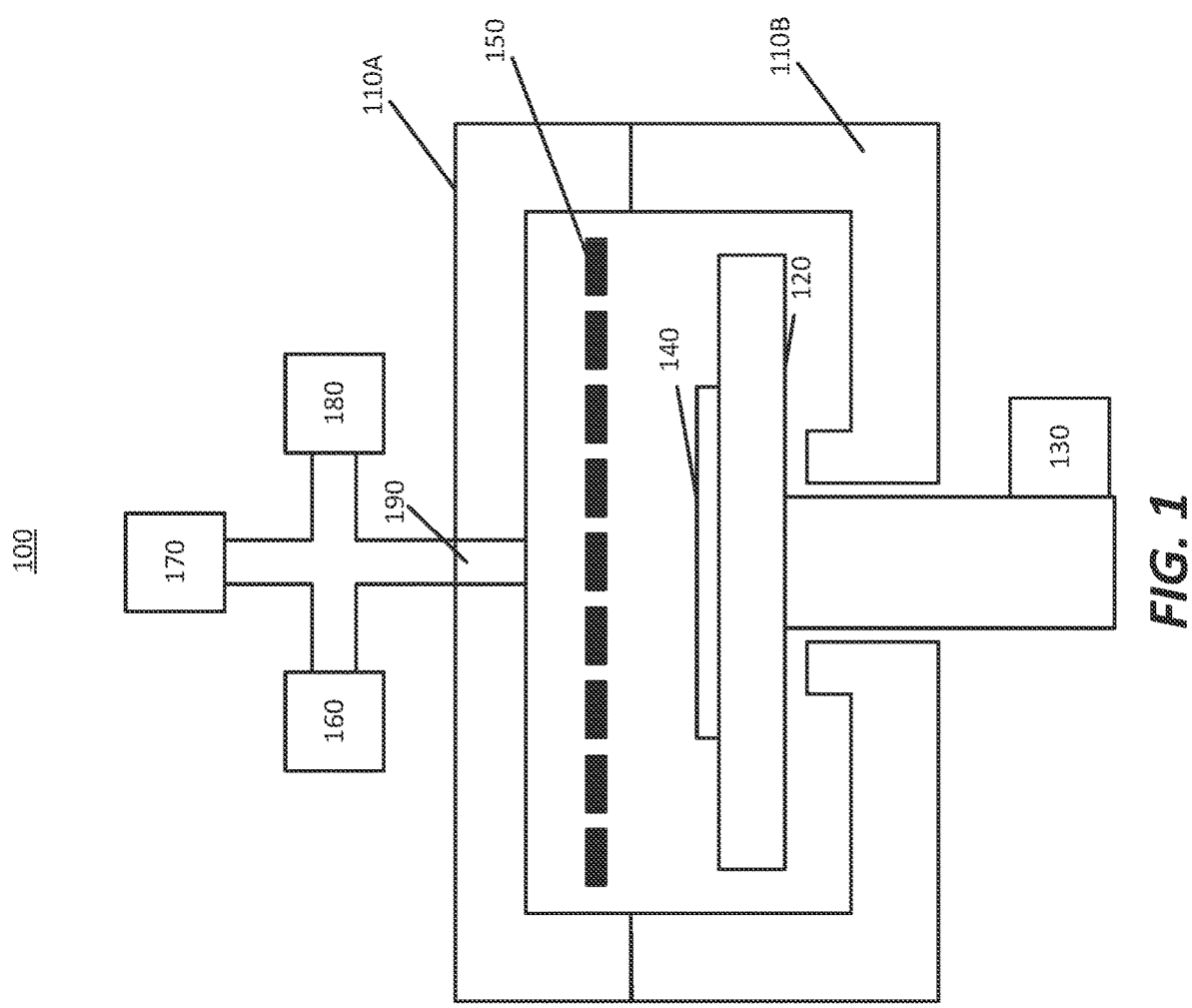
FIG. 1 illustrates a simplified schematic diagram of a reactor system, in accordance with various embodiments.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION

Although certain embodiments and examples are disclosed below, it will be understood by those in the art that the disclosure extends beyond the specifically disclosed embodiments and/or uses of the disclosure and obvious modifications and equivalents thereof. Thus, it is intended that the scope of the disclosure should not be limited by the particular embodiments described herein.

The illustrations presented herein are not meant to be actual views of any particular material, apparatus, structure, or device, but are merely representations that are used to describe embodiments of the disclosure.

As used herein, the term "substrate" may refer to any underlying material or materials that may be used, or upon which, a device, a circuit, or a film may be formed.

As used herein, the term "atomic layer deposition" (ALD) may refer to a vapor deposition process in which deposition cycles, preferably a plurality of consecutive deposition cycles, are conducted in a process chamber. During each cycle the precursor may be chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. This reactant may be capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, chemical vapor atomic layer deposition, atomic layer epitaxy (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As used herein, the term "chemical vapor deposition" (CVD) may refer to any process wherein a substrate is exposed to one or more volatile precursors, which react and/or decompose on a substrate surface to produce a desired deposition.

As used herein, the term "film" and "thin film" may refer to any continuous or non-continuous structures and material deposited by the methods disclosed herein. For example, "film" and "thin film" could include 2D materials, nanorods, nanotubes, or nanoparticles or even partial or full molecular layers or partial or full atomic layers or clusters of atoms and/or molecules. "Film" and "thin film" may comprise material or a layer with pinholes, but still be at least partially continuous.

As used herein, the term "gas" may include vaporized solid and/or liquid and may be constituted by a single gas or a mixture of gases.

Reactor systems used for ALD, CVD, and/or the like, may be used for a variety of applications, including depositing and etching materials on a substrate surface. FIG. 1 illustrates a reaction system 100 in accordance with at least one embodiment of the invention. The reaction system comprises: an upper reaction chamber assembly 110A; a lower reaction chamber assembly 110B; a susceptor 120 configured to hold a substrate 140; a susceptor positioning system 130 configured to move the susceptor 120 along an x-y plane; a gas distribution device 150 configured to evenly spread gases across the substrate 140; a first gas source 160 configured to provide a first gas; a second gas source 170 configured to provide a second gas; an inert gas source 180 configured to provide an inert gas; and a gas pathway 190 configured to link to inside the upper reaction chamber assembly 110A.

The upper reaction chamber assembly 110A may comprise multiple parts as well as ports to allow for gas hookups. The lower reaction chamber assembly 110B may comprise multiple rings and spacer plates. The susceptor 120 may comprise a heater to heat the substrate 140. The gas distribution device 150 is illustrated as a showerhead arrangement, but other gas distribution arrangements may be employed, such as a cross-flow gas distribution device or injection rakes.

In various embodiments, to achieve desired results from a process within a reaction chamber (e.g., material deposition or etching on a substrate), the susceptor (e.g., susceptor 120) may be disposed within the reaction chamber in a certain position. For example, to achieve uniform material deposition on and across a substrate, the susceptor 120 may be positioned in the center of the reaction chamber, such that the side(s) of the susceptor 120 are uniformly spaced from the interior sidewall(s) of the reaction chamber (e.g., lower reaction chamber assembly 110B). If such spacing between the susceptor and the reaction chamber interior side walls is not uniform, one portion of the substrate may be subjected to a greater amount of reactant gas within the reaction chamber than another portion of the substrate, cause non-uniform material deposition (i.e., an undesirable result).

Figure 2:
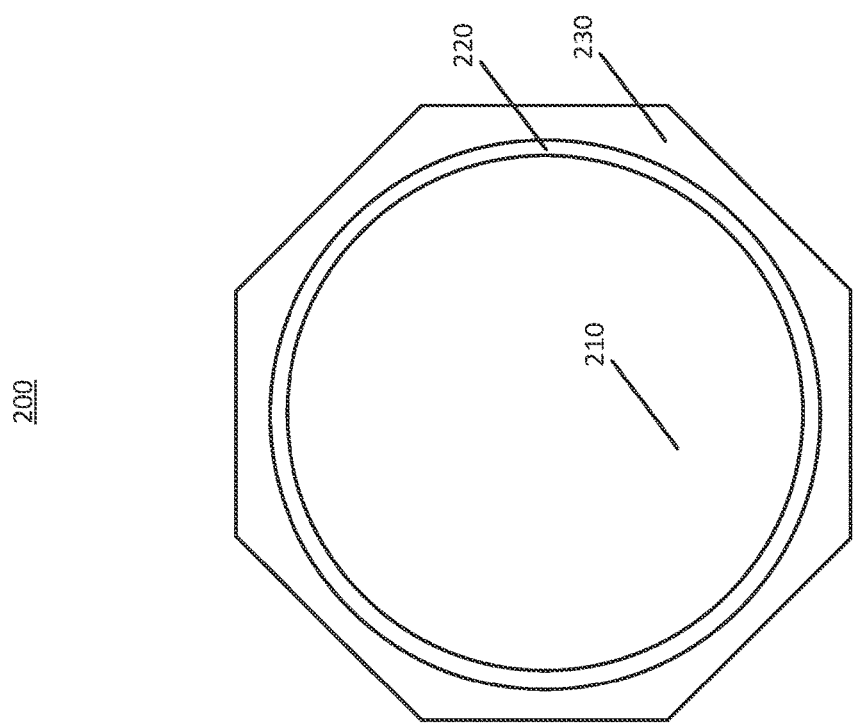
FIG. 2 illustrates a perspective view of a lower portion of a reactor system, in accordance with various embodiments.

FIG. 2 illustrates a lower reaction chamber assembly 200 from a top bird's eye perspective. The lower reaction chamber assembly comprises: a susceptor 210; a flow control ring 220; and a spacer plate 230. The alignment of these three components may greatly affect uniformity of thin films deposited across a substrate disposed on the susceptor 210.

The flow control ring 220 surrounds the susceptor 210 and may be responsible for regulating a flow of gas to an exhaust. The flow control ring 220 may comprise a material such as quartz, ceramic, or a metal, such as titanium, aluminum, stainless steel, or Hastelloy, for example. The spacer plate 230 may surrounds the flow control ring 220 and provides a surface for mounting the flow control ring 220. The spacer plate 230 may comprise a material such as titanium, aluminum, stainless steel, or Hastelloy, for example.

Figure 3:
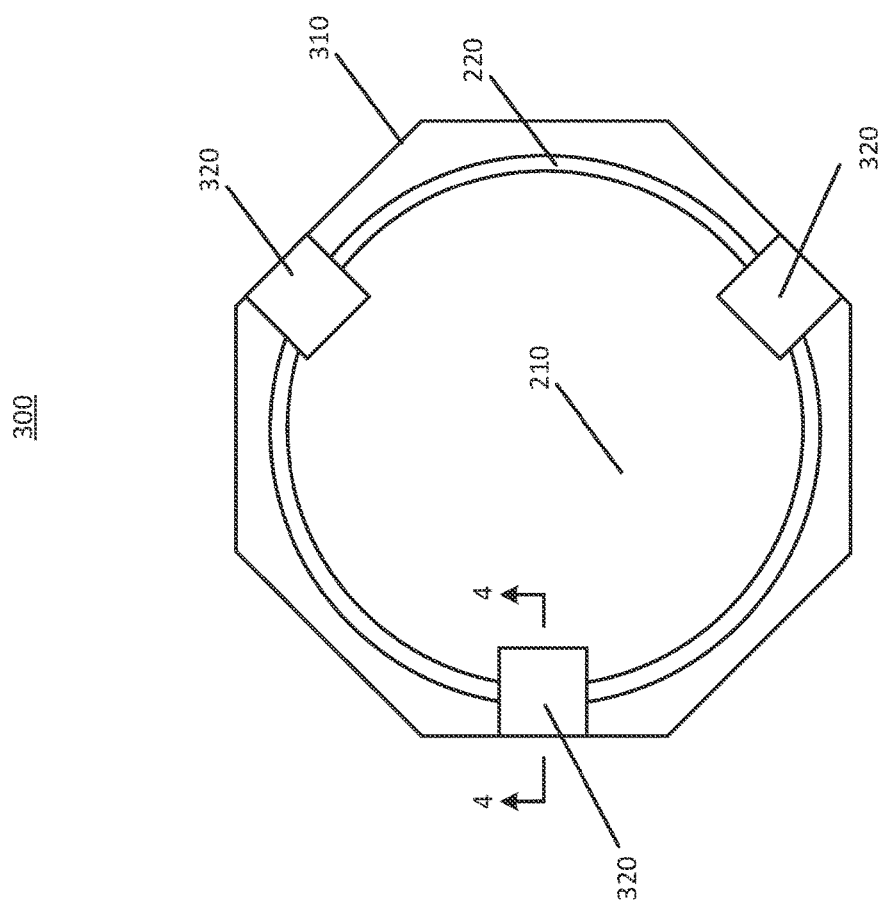
FIG. 3 illustrates a perspective view of an alignment fixture for a reaction chamber, in accordance with various embodiments.

FIG. 3 illustrates a laser alignment fixture 300 in accordance with at least one embodiment of the invention. The laser alignment fixture 300 is design to fit directly over the lower reaction chamber assembly 200, and may sense the position of at least the susceptor 210 and the flow control ring 220. The laser alignment fixture 300 may be placed on top of the lower reaction chamber assembly 200 through the use of a lift. The laser alignment fixture 300 comprises: a lid assembly 310; and a laser and sensor assembly 320. The lid assembly 310 may comprise a material such as titanium, aluminum, stainless steel, or Hastelloy.

Illustrated in FIG. 3 is a plurality of laser and sensor assemblies 320 disposed on top of the lid assembly 310. The laser and sensor assemblies 320 are illustrated to be disposed equidistantly across the susceptor 210 and the flow control ring 220. At least three laser and sensor assemblies 320 may be required in order to provide an accurate measurement and alignment of the components in the lower reaction chamber assembly 200.

Figure 4:
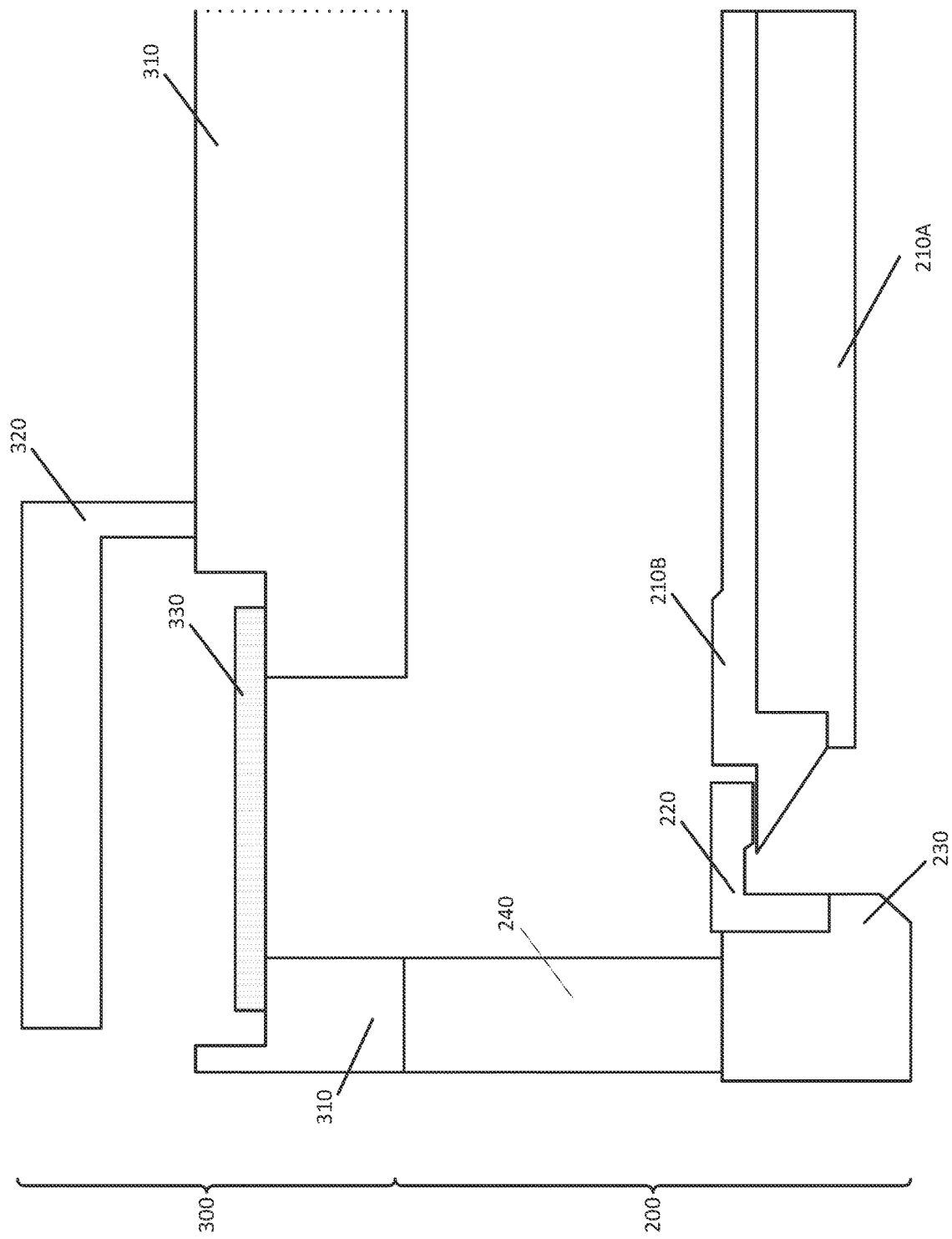
FIG. 4 illustrates a side view of an alignment fixture disposed on a reactor system, in accordance with various embodiments.

FIG. 4 illustrates a side view of the laser alignment fixture 300 when disposed on the lower reaction chamber assembly 200 in accordance with at least one embodiment of the invention. The lower reaction chamber assembly 200 comprises: a substrate heater 210A; a substrate holder 210B; a flow control ring 220; a spacer plate 230; and a lower reaction chamber sidewall 240. For ease of illustration, o-rings and other components allowing for sealing between different parts of the lower reaction chamber assembly 200 and the laser alignment fixture 300 are omitted from the figure.

The laser alignment fixture 300 comprises: a lid assembly 310; a laser and sensor assembly 320; and a quartz viewport 330. The laser and sensor assembly 320 may comprise a bracket installed on the lid assembly that also includes a laser and a sensor disposed above the quartz viewport 330. The laser and sensor assembly 320 are positioned in a way to be able to view at least one of: the substrate holder 210B, the flow control ring 220, and the spacer plate 230.

Figure 5:
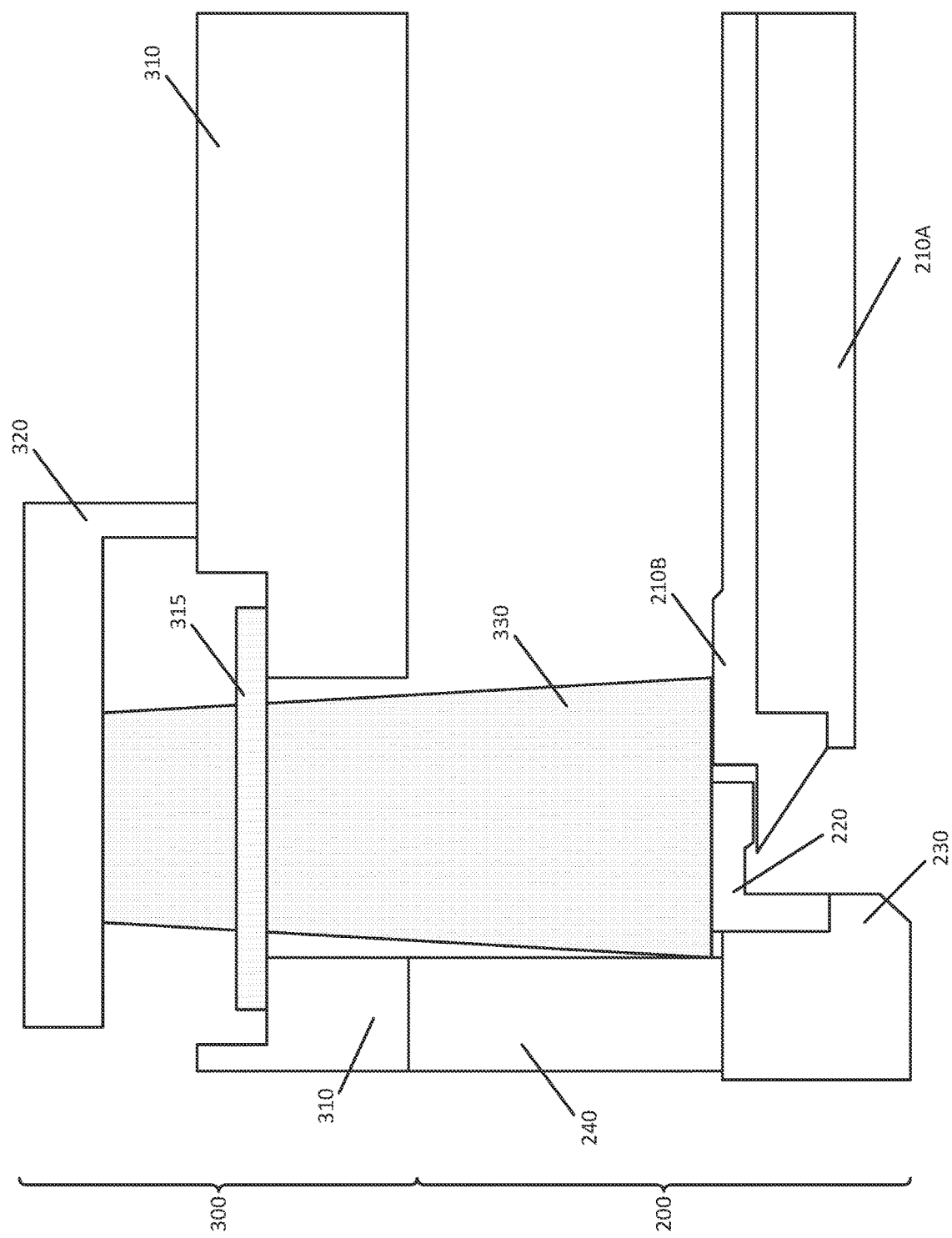
FIG. 5 illustrates a side view of an alignment fixture disposed on a reactor system, in accordance with various embodiments.

FIG. 5 illustrates of the laser alignment fixture 300 when a laser in the laser and sensor assembly 320 produces a light 340. The light 340 is incident on at least one of: the substrate holder 210B; the flow control ring 220; or the spacer plate 230. The light 340 is reflected back (not shown in illustration) from at least one component of the lower reaction chamber assembly 200 into a light sensor disposed in the laser and sensor assembly 320.

Figure 6:
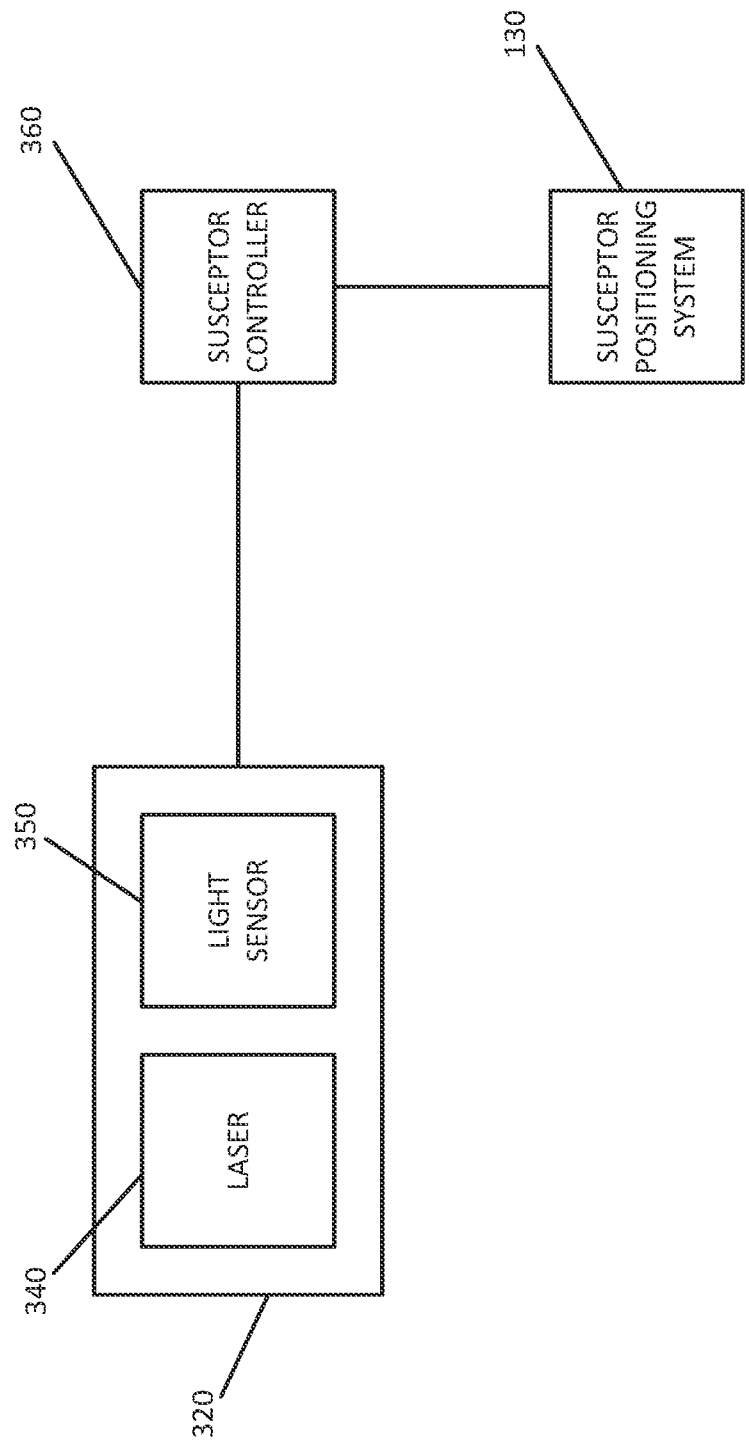
FIG. 6 illustrates a schematic for an alignment fixture, in accordance with various embodiments.

FIG. 6 illustrates a schematic of a laser alignment fixture in accordance with at least one embodiment of the invention. The laser alignment fixture comprises a laser and sensor assembly 320. The laser and sensor assembly 320 comprises: a laser 340; and a light sensor 350. The laser 340 may comprise a laser source packaged by Keyence Corp. The light sensor 350 may comprise a sensor packaged by Keyence Corp.

A signal produced from the light sensor 350 may then be sent to a susceptor controller 360. The susceptor controller 360 may then make a determination to adjust the position of the susceptor 120 by providing a movement instruction to the susceptor positioning system 130.

The susceptor controller 360 may comprise a computer or a human operator. In case the susceptor controller 360 comprises a computer, an automatic instruction may be sent to the susceptor positioning system 130, to result in an automated operation of the laser alignment fixture.

Benefits and other advantages have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods and apparatus are provided herein. In the detailed description herein, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, two or more components being "coupled" may mean a physical, mechanical, fluid, and/or electrical coupling, as may be dictated by the respective context. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A laser alignment fixture for a reactor system, comprising:
    a lid assembly configured to be placed on the reactor system, the lid assembly comprising at least one viewing window;
    a plurality of laser and sensor assemblies disposed on the lid assembly;
    wherein the reactor system comprises:
        a susceptor; and
        a susceptor positioning system; and
    wherein the plurality of laser and sensor assemblies shine and sense a light used to determine a position of the susceptor;
    wherein the laser alignment fixture is configured to transmit light from a laser of a laser and sensor assembly of the plurality of laser and sensor assemblies to pass through a viewing window of the at least one viewing window and reflect back from at least one component of the reactor system through the viewing window of the at least one viewing window to the laser and sensor assembly; and
    wherein the light is used to adjust the position of the susceptor by using the susceptor positioning system.

2. The laser alignment fixture of claim 1, wherein the lid assembly comprises at least one of: titanium, aluminum, stainless steel, or Hastelloy.

3. The laser alignment fixture of claim 1, wherein the viewing window comprises a transparent material.

4. The laser alignment fixture of claim 3, wherein the viewing window comprises quartz.

5. The laser alignment fixture of claim 1, wherein the plurality of laser and sensor assemblies are disposed equidistantly around the susceptor.

6. The laser alignment fixture of claim 5, wherein the plurality of laser and sensor assemblies consist of three laser and sensor assemblies, wherein each of the plurality of laser and sensor assemblies are disposed above an edge of the susceptor, and disposed 120 degrees around the susceptor from each other.

7. A laser alignment fixture for a reactor system, comprising:
   a lid assembly configured to be placed on the reactor system, the lid assembly comprising at least one viewing window, and the reactor system comprising a reactor component; and
   a plurality of laser and sensor assemblies disposed on the lid assembly;
   wherein the plurality of laser and sensor assemblies shine and sense a light used to determine a position of the reactor component; and
   wherein the laser alignment fixture is configured to transmit light from a laser of a laser and sensor assembly of the plurality of laser and sensor assemblies to pass through a viewing window of the at least one viewing window and reflect back from at least one component of the reactor system through the viewing window of the at least one viewing window to the laser and sensor assembly.

8. The laser alignment fixture of claim 7, wherein the reactor further comprises a component positioning system, and wherein the light is used to adjust the position of the reactor component by using the component positioning system.

9. The laser alignment fixture of claim 8, further comprising a controller configured to receive a signal from the plurality of laser and sensor assemblies.

10. The laser alignment fixture of claim 9, wherein the controller provides an instruction to the component positioning system to move the reactor component.

11. The laser alignment fixture of claim 9, wherein the controller comprises a human operator.

12. The laser alignment fixture of claim 9, wherein the controller comprises a computer.

13. The laser alignment fixture of claim 7, wherein the viewing window comprises a transparent material.

14. The laser alignment fixture of claim 7, wherein the lid assembly comprises at least one of: titanium, aluminum, stainless steel, or Hastelloy.

15. A laser alignment fixture for a reactor system, comprising:
   a lid assembly configured to be placed on the reactor system, the lid assembly comprising a viewing window, and the reactor system comprising a reactor component; and
   a laser and sensor assembly disposed on the lid assembly;
   wherein the laser and sensor assembly shines and senses a light used to determine a position of the reactor component; and
   wherein the laser alignment fixture is configured to transmit light from a laser of the laser and sensor assembly to pass through the viewing window and reflect back from at least one component of the reactor system through the viewing window to the laser and sensor assembly.

16. The laser alignment fixture of claim 15, wherein the reactor further comprises a component positioning system, and wherein the light is used to adjust the position of the reactor component by using the component positioning system.

17. The laser alignment fixture of claim 16, further comprising a controller configured to receive a signal from the laser and sensor assembly.

18. The laser alignment fixture of claim 17, wherein the controller provides an instruction to the component positioning system to move the reactor component.

19. The laser alignment fixture of claim 15, wherein the lid assembly comprises at least one of: titanium, aluminum, stainless steel, or Hastelloy.

20. The laser alignment fixture of claim 15, wherein the viewing window comprises a transparent material.

* * * * *